United States Patent
Oh et al.

[11] Patent Number: 5,814,822
[45] Date of Patent: Sep. 29, 1998

[54] ION IMPLANTER AND ION IMPLANTING METHOD USING THE SAME

[75] Inventors: Sang-geun Oh, Suwon; Sang-young Moon, Ansan; Jeong-gon Kim; Do-hyeong Kim, both of Suwon, all of Rep. of Korea

[73] Assignee: Samsung Electronics Co., Ltd., Suwon, Rep. of Korea

[21] Appl. No.: 771,772

[22] Filed: Dec. 20, 1996

[30] Foreign Application Priority Data

Dec. 22, 1995 [KR] Rep. of Korea ............... 1995-54714

[51] Int. Cl.$^6$ ........................................ H01J 49/42
[52] U.S. Cl. ......................... 250/492.21; 250/396 R
[58] Field of Search ................. 250/492.21, 492.2, 250/398, 396 R, 396 ML

[56] References Cited

U.S. PATENT DOCUMENTS 4,514,637  4/1985  Dykstra et al. ............... 250/492.21

*Primary Examiner*—Kiet T. Nguyen
*Attorney, Agent, or Firm*—Jones & Volentine, L.L.P.

[57] ABSTRACT

An ion implanter and an ion implanting method compatible for both positive and negative ions. The ion implanter has an ion extractor and a mass analyzer for deflecting ions, having one of a positive or negative charged state, in a predetermined direction regardless of the charged state of the ions. A polarity converter changes the flux direction of a magnetic field in the mass analyzer according to the charged state of the ions. Thus, shallow and deep impurity layers can be formed into wafers without changing ion implanters, such that $BF^+$ as well as $B^+$ or $P^+$ can be implanted with a single ion implanter. As a result, the product yield of a semiconductor device can be improved.

9 Claims, 2 Drawing Sheets

ION IMPLANTER AND ION IMPLANTING METHOD USING THE SAME

BACKGROUND OF THE INVENTION

1. Field of the Invention

The present invention relates to an ion implanter and an ion implanting method, and more particularly, to an ion implanter compatible for either positive or negative ions and an ion implanting method that utilizes the ion implanter.

2. Description of the Related Art

In the fabrication of semiconductor devices, ion implantation is one of the most significant processes in determining the reliability of a semiconductor device. Ion implanters are generally grouped into two types: one for deep impurity layer formation and the other for shallow impurity layer formation. An ion implanter for forming a shallow impurity layer includes medium-current implanters and high-current implanters. The ion implanter accelerates positive ion impurities, e.g., boron (B), phosphorous (P) or arsenic (As), and implants the accelerated ions into a wafer.

On the other hand, an ion implanter for forming a deep impurity layer is provided with an ion converter in addition to a conventional ion implanter for implanting positive ions. When implanting $B^+$ or $P^+$ ions with this type of implanter, the positive ions are converted into negative ions by the ion converter. Hence, with equal acceleration energy, the positive ions in the accelerator have a gain which has twice the energy of that in an accelerator of the conventional ion implanter.

To form a shallow impurity layer with the "deep-type" ion implanter having such an ion converter, $BF^+$ ions, which are widely used for forming a shallow impurity layer, should be converted into negative ions. However, the bond between the $BF^+$ ions is very likely to be broken during the conversion. Furthermore, without the ion conversion provided by the ion converter, the deflection of the positive ions in a mass analyzer is carried out in a direction opposite to that of the negative ions, thus rendering the accelerator useless.

FIG. 1 shows the conventional ion implanter having an ion converter. The conventional ion implanter is comprised of an ion generator 10, an ion extractor 12, an ion converter 14, a mass analyzer 16, an accelerator 18, a concentrator or converger 20, and an ion measurer 22. Here, the ion converter 14 converts positive ions into negative ions. The implantation of ion impurities using the ion implanter constituted as above will be described.

First, ions are generated in the ion generator 10. The ion extractor 12 extracts the ions required for ion implantation from the generated ions, and then the extracted ions are converted into negative ions in the ion converter 14. Here, since magnesium readily supplies electrons to the positive ions at 250° C. or above, magnesium is used as an electron source material for the positive-to-negative ion conversion, and the conversion temperature in the ion converter 14 is set to at least 250° C.

The negative ions from the ion converter 14 are deflected in the mass analyzer 16. The deflection degree varies due to several factors including the strength of a magnetic field in the mass analyzer 16, and the mass, degree of ionization, and velocity of ions introduced into the mass analyzer 16. Once the ion material is determined, the ions introduced into the mass analyzer 16 can be accurately deflected to the accelerator 18 by adjusting the magnetic field of the mass analyzer 16, while taking into account the mass and degree of ionization of the determined ion material.

The negative ions accelerated by the accelerator 18 are converged by the converger 20, and the converged negative ions are ultimately introduced into a reaction chamber (not shown) through the ion measurer 22. The negative ions are restored to positive ions in the reaction chamber through a well-known method and implanted into a wafer.

As described above, the conventional "deep-type" ion implanter can be used to convert boron or phosphorous ions into negative ions to form a deep impurity layer into a wafer. However, the conventional "deep-type" ion implanter cannot be used to form a shallow impurity layer with $BF^+$ ions because the bond between the $BF^+$ ions is easily broken during the negative-ionization. Here, if positive ions are introduced into a mass analyzer without converting the positive ions into negative ions, the deflection would be in a direction opposite to that for negative ions, rendering the accelerator useless.

Therefore, when implanting ions using conventional ion implanters, different ion implanters must be selected according to the charged state of particles. As a result, the productivity of a semiconductor device is low.

SUMMARY OF THE INVENTION

To overcome these and other problems encountered in the conventional technology, it is an object of the present invention to provide an ion implanter compatible for either polarity, thus enhancing the product yield of a semiconductor device.

It is another object of the present invention to provide an ion implanting method using the above ion implanter.

To achieve the above object, there is provided an ion implanter, comprising: an ion extractor; a mass analyzer for deflecting ions, having one of a positive or negative charged state, in a predetermined direction regardless of the charged state of the ions, the ions being introduced to the mass analyzer from the ion extractor; and a polarity converter for selectively changing a flux direction of a magnetic field in the mass analyzer, the flux direction being changed according to the charged state of the ions.

The polarity converter has a means for changing the direction of a current flowing through an electromagnet which generates a magnetic field in the mass analyzer. The means for changing may be a relay, motor, or other equivalent device.

To achieve another object, there is provided an ion implanting method comprising the steps of: (a) generating ions; (b) deflecting the ions in a predetermined direction regardless of the charged state of the ions; and (c) accelerating and converging the deflected ions. A polarity converter having a motor or relay is used to change the flux direction of a magnetic field according to the charged state of the ions.

Thus, the ion implanter of the present invention implants either positive or negative ions into a wafer. An ion implantation method using the present inventive implanter leads to enhanced product yields for semiconductor devices.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
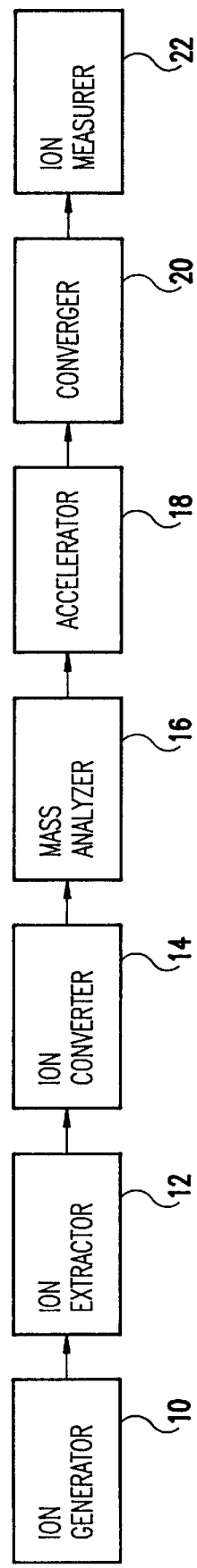
FIG. 1 is a block diagram schematically illustrating the functional relationship of the elements of a conventional ion implanter.
Figure 2:
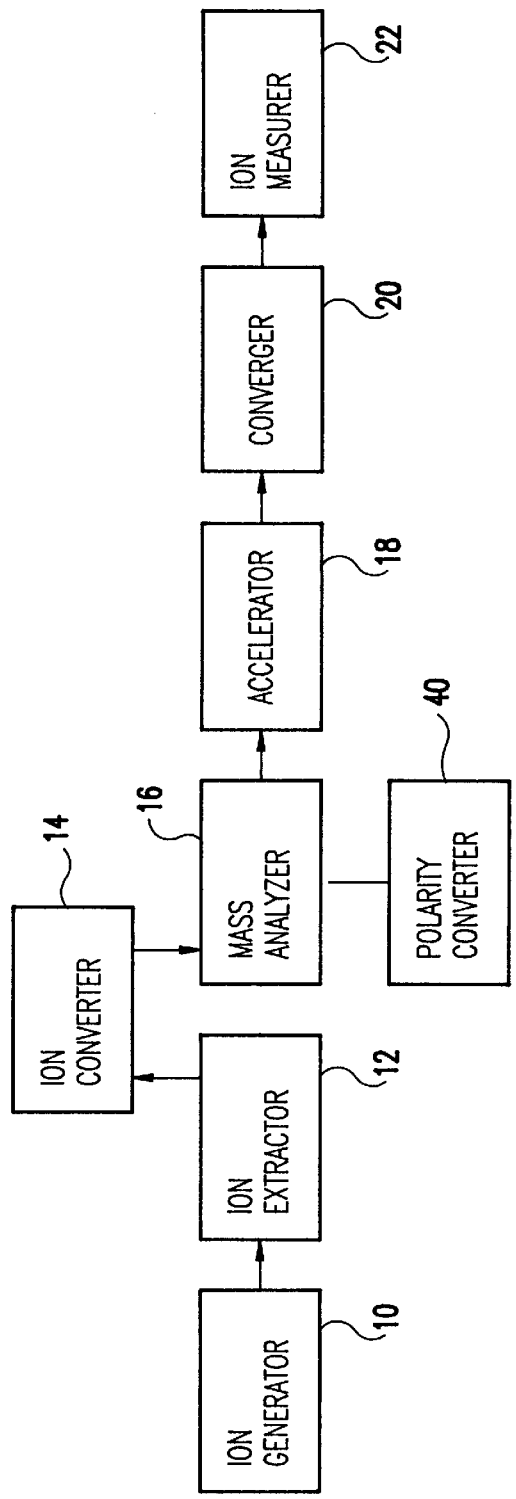
FIG. 2 a block diagram schematically illustrating the functional relationship of the elements of an ion implanter of the present invention.

FIG. 2 is a block diagram of the ion implanter of the present invention.

As illustrated in FIG. 2, in the present invention a polarity converter 40 is added to the conventional ion implanter. As described in more detail later in the specification, in "deep-type" ion implantations, the polarity converter 40 is not utilized, while in "shallow-type" ion implantations, the polarity converter 40 is used, but the ion converter 14 is bypassed. More particularly, the ion implanter of the present invention is comprised of an ion generator 10, an ion extractor 12, an ion converter 14, a mass analyzer 16, a polarity converter 40, an accelerator 18, a converger 20, and an ion measurer 22.

Generally, a uniform magnetic field is generated in the mass analyzer 16 by an electromagnet. Thus, force is applied, according to Fleming's left-hand rule, to charged particles introduced into the mass analyzer 16, for the purpose of deflecting the charged particles. The flux direction of the magnetic field is changed by changing the direction of current flowing through the electromagnet.

The polarity converter 40 functions to change the flux direction of the magnetic field in the mass analyzer 16. For this purpose, a motor, relay, or other equivalent device for changing a current direction, is associated with the polarity converter 40 to be used as a means for changing the direction of the current flowing through the electromagnet of the mass analyzer 16.

Figure 3:
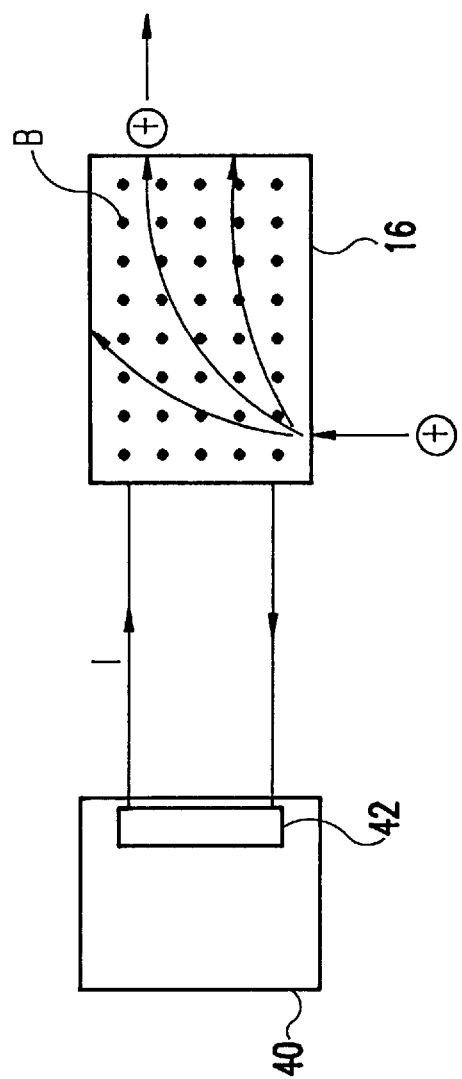
FIG. 3 is a schematic view illustrating the interaction between a polarity converter and a mass analyzer in the ion implanter of the present invention.

FIG. 3 illustrates the interaction between the mass analyzer 16 and the polarity converter 40. Reference character B denotes a magnetic field within the mass analyzer 16, and reference character I denotes current flowing through an electromagnet in the mass analyzer 16. A block denoted by reference numeral 42 in the polarity converter 40 represents the means for changing the direction of the current I flowing through the electromagnet of the mass analyzer 16. The means 42 may be a motor or relay, for example. In FIG. 3, the magnetic field B is represented by arrows pointing upward from the face of the paper. Hence, if charged particles introduced into the mass analyzer 16 are positive, the positively-charged particles deflect to the right, as shown.

On the other hand, if the particles introduced into the mass analyzer 16 are negatively charged, they would deflect to the left. However, by changing the direction of the current I flowing through the electromagnet in the mass analyzer 16 (by using the polarity converter 40), the flux direction of the magnetic field B in the mass analyzer 16 also changes. That is, the magnetic field B would be oriented in a direction into the paper in FIG. 3. Thus, the magnetic field B is reversed, which in turn reverses the magnetic force applied to the negatively-charged particles. As a result, when the negatively-charged particles enter the mass analyzer 16 they deflect to the right.

Now, both "deep-type" and "shallow-type" ion implanting methods will be described using the above ion implanter according to the present invention.

First, the process of implanting $B^+$ or $P^+$ ions into a wafer to form a deep impurity layer will be described.

Ions are generated in the ion generator 10. Then, the ions required for ion implantation are extracted from the generated ions in the ion extractor 12. The extracted ions, for example, $B^+$ ions or $P^+$ ions, are converted into negative ions by the ion converter 14, under the same conditions as in the conventional process. The negative ions are then deflected toward the accelerator 18 by the mass analyzer 16. The accelerated negative ions are converged by converger 20, and then they are implanted into a wafer in a reaction chamber. Note that during the ion implantation for forming a deep impurity layer, the polarity converter 40 does not perform its intended function, thus having no effect on the above ions.

Next, the process of implanting $BF^+$ ions into a wafer to form a shallow impurity layer will be described.

The $BF^+$ ions are introduced into the ion converter 14 through the ion generator 10 and the ion extractor 12. However, for shallow impurity layer ion implantation, the temperature for conversion is reduced to 250° C. or below in the ion converter 14, or the ion converter 14 is turned off. Under these conditions, the $BF^+$ ions enter the mass analyzer 16 through the ion converter 14, with the polarity of the $BF^+$ ions unchanged. In effect, the ion converter 14 is bypassed.

In the shallow impurity layer ion implantation, the polarity converter 40 is used as a means for deflecting the ions introduced into the mass analyzer 16 in a predetermined direction, regardless of the charged state of the ions. That is, the polarity converter 40 serves to change the flux direction of a magnetic field generated in the mass analyzer 16.

To change the flux direction of the magnetic field, the direction of a current flowing through an electromagnet of the mass analyzer 16 should be changed. A first means for achieving this purpose comprises a motor or relay 42 associated with the polarity converter 40. The current flowing through the magnet of the mass analyzer 16 is reversed by the relay or motor, resulting in a reversal of the flux direction of the magnetic field in the mass analyzer 16. Thus, magnetic force is applied to the $BF^+$ ions in the same direction as would be applied to the negative ions, thereby accurately deflecting the ions toward the accelerator 18. Subsequently, the $BF^+$ ions take the same path as in the conventional technology (i.e., acceleration and convergence).

In the present invention, ion implanting is performed by adopting an ion implanter compatible for both positive and negative ions. Accordingly, both shallow and deep impurity layers can be formed into wafers without changing ion implanters, which is impossible in the conventional ion implanting method. In other words, $BF^+$ impurities as well as $B^+$ and $P^+$ impurities can be implanted with a single ion implanter. As a result, the product yield of a semiconductor device can be greatly improved.

The present invention is not confined to the above embodiment, and it is clearly understood that many variations are possible within the scope and spirit of the present invention by anyone skilled in the art.

What is claimed is:

1. An ion implanter, comprising:
   an ion extractor;
   a mass analyzer for deflecting ions, having one of a positive or negative charged state, in a predetermined direction regardless of the charged state of said ions, said ions being introduced to said mass analyzer from said ion extractor; and
   a polarity converter for selectively changing a flux direction of a magnetic field in said mass analyzer, said flux direction being changed according to the charged state of said ions.

2. An ion implanter as claimed in claim 1, wherein said polarity converter includes means for changing a direction of a current flowing through an electromagnet that generates said magnetic field in said mass analyzer.

3. An ion implanter as claimed in claim 2, wherein said means for changing is a relay.

4. An ion implanter as claimed in claim 2, wherein said means for changing is a motor.

5. An ion implanter as claimed in claim 1, further comprising an accelerator that receives the ions from the mass analyzer for accelerating said ions.

6. An ion implanter as claimed in claim 5, further comprising a converger that receives the ions from the accelerator for converging said ions.

7. An ion implanting method comprising the steps of:

generating ions;

deflecting said ions, having one of a positive or negative charged state, in a predetermined direction regardless of the charged state of said ions, utilizing a mass analyzer having means for changing a flux direction of a magnetic field according to the charged state of said ions; and accelerating and converging said deflected ions.

8. An ion implanting method as claimed in claim 7, wherein said means for changing in said deflecting step is a polarity converter having a motor for changing a direction of a current flowing through an electromagnet that is used to generate said magnetic field in said mass analyzer.

9. An ion implanting method as claimed in claim 7, wherein said means for changing in said deflecting step is a polarity converter having a relay for changing a direction of a current flowing through an electromagnet that is used to generate said magnetic field in said mass analyzer.

* * * * *